United States Patent [19]

Murphy et al.

[11] Patent Number: 5,396,404
[45] Date of Patent: Mar. 7, 1995

[54] HEAT SINKING ASSEMBLY FOR ELECTRICAL COMPONENTS

[75] Inventors: William S. Murphy; David A. King, both of Kokomo, Ind.

[73] Assignee: Delco Electronics Corp., Kokomo, Ind.

[21] Appl. No.: 123,478

[22] Filed: Sep. 20, 1993

[51] Int. Cl.6 .............................................. H05K 7/20
[52] U.S. Cl. ................................. 361/719; 257/727; 361/710
[58] Field of Search .............. 165/80.3, 185; 361/704, 361/707, 709, 710, 717, 718, 719, 722, 807, 809, 810; 174/16.3; 267/150, 160; 257/706, 707, 713, 727

[56] References Cited

U.S. PATENT DOCUMENTS

| | | | |
|---|---|---|---|
| 3,366,171 | 1/1968 | Scharli | 361/710 |
| 3,911,327 | 10/1975 | Murari | 361/704 |
| 4,167,031 | 9/1979 | Patel | 361/388 |
| 4,259,685 | 3/1981 | Romano | 357/81 |
| 4,576,224 | 3/1986 | Eaton | 361/710 |
| 4,922,601 | 5/1990 | Mikolajczak | 29/450 |
| 4,923,179 | 5/1990 | Mikolajczak | 267/160 |
| 5,060,112 | 10/1991 | Cocconi | 361/710 |
| 5,109,317 | 4/1992 | Miyamoto | 361/386 |
| 5,134,545 | 7/1992 | Smith | 361/388 |
| 5,274,193 | 12/1993 | Bailey | 174/16.3 |

*Primary Examiner*—Gerald P. Tolin
*Attorney, Agent, or Firm*—Mark A. Navarre

[57] ABSTRACT

A heat sink assembly for dissipating thermal energy from a heat generating electrical components wherein the heat sinking includes a component support member and a cover which surrounds and clamps the electric component to the heat sink and a method of heat sinking where the parts are not heat sunk until the cover is attached to the circuit board. The clamping force for the electrical component may also be varied for optimum heat transfer.

6 Claims, 5 Drawing Sheets

HEAT SINKING ASSEMBLY FOR ELECTRICAL COMPONENTS

BACKGROUND OF THE INVENTION

1. Field of the Invention

The instant invention relates to a method and an apparatus for power IC heat sinking which provides positioning and clamping forces using a package case/cover for direct mounting heat sinking. For the "Spruce" method of heat sinking in accordance with the invention, the electrical components are not heat sunk until the cover of the casing assembly is attached to the circuit board.

2. Description of Related Art

Most electrical components generate thermal energy. Some such devices generate so much heat that the device itself may be damaged or may operate improperly unless excess thermal energy is removed during operation. Mechanical and thermal contact assemblies in the form of heat sinks of various forms are conventionally used to protect electronic devices from excess heat. Typically, mechanical and thermal contact assemblies require additional mounting structures, such as rivets, screws, or other hardware, to attach or contact the electrical component to the heat sink. In an effort to eliminate the additional mounting structures, the prior art teaches the use of spring clips to attach the electronic components to the heat sink(s).

Generally, there are two methods presently used for mounting the heat generating electrical components to a heat sink. The first method mounts the component in a conventional manner to the heat sink (parts stand perpendicular to the circuit board) and the necessary normal forces are provided by a plastic clamp, compressing the component to the heat sink. An example of this method is shown in FIG. 1. However, the method of FIG. 1 requires additional fasteners which increases assembly time. Over time these fasteners may become disengaged thus reducing heat transfer efficiency.

As shown in FIGS. 1 and 2, conventional heat sink arrangements require clamps 2 and fasteners 4 to attach the electrical component 1 to the heats sink 6. As shown in FIG. 3, this arrangement sandwiches the heat generating component 1 between the clamp 2 and the heat sink 6 to ensure proper thermal contact therewith. This arrangement incurs the drawback of increased assembly time and often results in the loss of proper thermal contact when the fastener become disengaged.

A second method mounts the electrical component directly to the controller case referred to as alternate lead form (ALF) mounting, and the necessary clamping forces are generated when the joining case halves are fastened together, an example of this prior art is shown in FIG. 4.

FIG. 4 illustrates a conventional arrangement whereby the heat generating component 1 is positioned on its side on the circuit board 11, and the casing enclosure 13 provides the clamping force to ensure proper thermal contact between the component and the heat sink. However, this second method serves to greatly reduce the usable circuit board area after assembly.

U.S. Pat. No. 5,060,112 issued on Oct. 22, 1991 to A.G. Cocconi also discloses an electrical component assembly with a heat sink and a method for providing the assembly with leaf springs for improving the thermal contact between the heat generating components and the heat sink. However, this arrangement is difficult to assemble and requires a number of functional parts.

SUMMARY OF THE INVENTION

The present invention provides a simplified yet efficient arrangement for positioning electrical components, whereby the clamping forces are attained by the package case/cover assembly for a direct mount heat sink arrangement.

In the "Spruce" method of heat sinking, heat sunk parts are placed onto a circuit board during the stick-lead process of powertrain control modules (PCM) assembly. The parts could be placed separately on the circuit board adjacent the heat sink, or a heat sink assembly may be built off-line with the electrical components premounted to a heat sink. For the "Spruce" method, the heat generating components are not heat sunk until the cover is attached to the PCM. As the cover is attached to the PCM, the clamping forces are generated on the heat sunk parts by the cover to make the necessary interface for required thermal performance. In summary, this method will provide the superior thermal performance of the Alternate Lead Form (ALF) mounting method at the minimum used circuit board area of the conventional method,

DETAILED DESCRIPTION OF THE PREFERRED EMBODIMENT

The following description of the instant invention is not to be taken in a limiting sense, but is made merely for the purpose of illustrating the general principles of the invention. The description presents the best mode for carrying out the instant invention.

Figure 1:
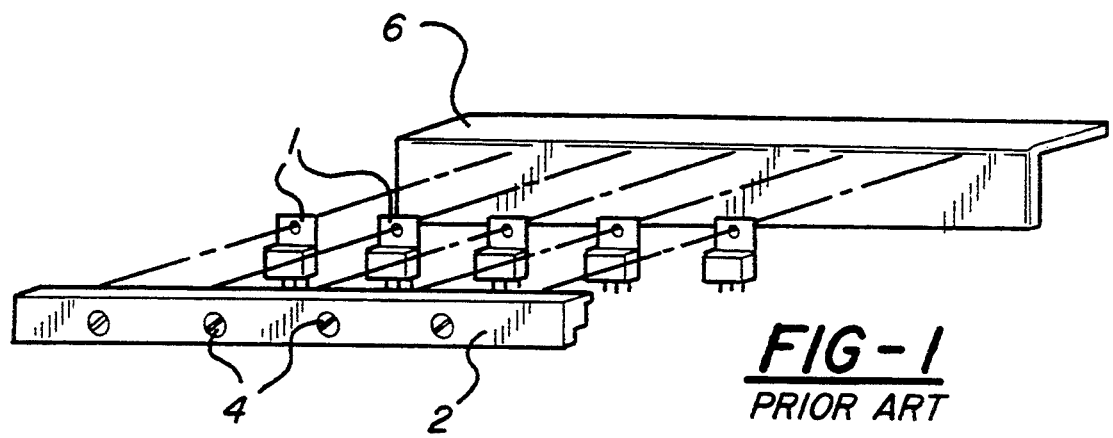
FIGS. 1 and 2 are perspective views of the first prior art method of power IC heat sinking.
Figure 2:
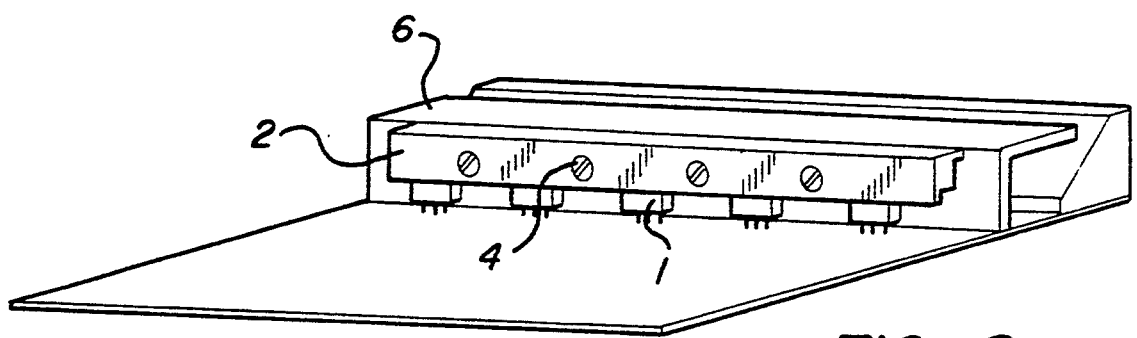
Figure 3:
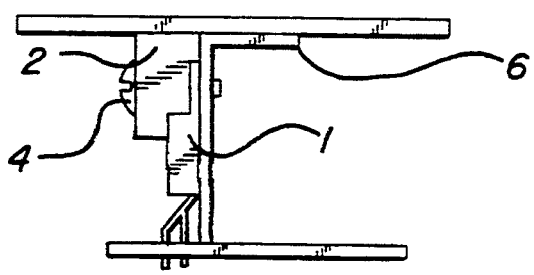
FIG. 3 is a side view of the first prior art method of power IC heat sinking as shown in FIG. 1.
Figure 4:
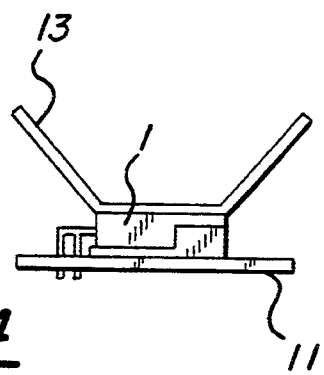
FIG. 4 is the prior art Alternate Lead Form (ALF) mounting method of power IC heat sinking.
Figure 5:
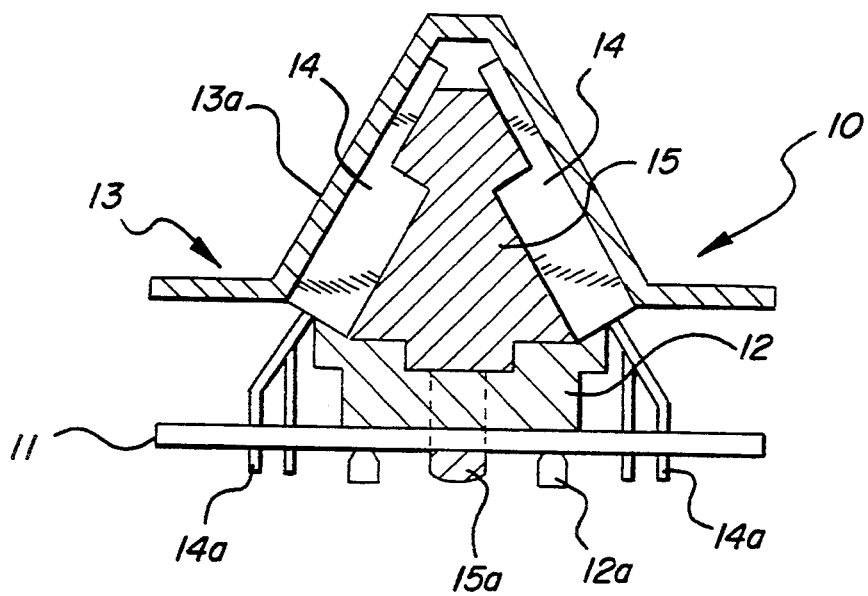
FIG. 5 is a side view of the preferred embodiment of the invention.

With reference to FIG. 5, the heat sink arrangement 10 comprises a printed circuit board 11 with a retainer 12 mounted thereto by means of projections 12a which are received in the circuit board. The retainer 12 is formed so as to receive a force applicator 15, wherein the force applicator is provided with stanchions 15a which pass through the retainer 12 and circuit board 11 in the manner illustrated in FIG. 5. The stanchions 15a provide a means by which the contact force between the component 14 and the heat sink assembly may be varied as required for optimum heat transfer for a particular application.

During assembly, the components 14 are position on the force applicator 15, which is then affixed to the circuit board 11. Specifically, the retainer 12, the force applicator 15, and the electrical component are provided with projections 12a, 15a, and leads 14a, respectively, which pass through corresponding apertures provided in the circuit board 11. The retainer is then affixed to the circuit board 11 for instance by snap fit arrangement with the leads 14a of the component 14 being soldered accordingly. The components 14 may consist of any of a number of various known electrical components, i.e. transistor, transformer, inductor and the like. In the preferred embodiment, the force applicator 15 is provided with recesses 16 (FIG. 6) appropriately formed to receive the components 14 in an upright or angled position relative to the circuit board 11. The applicator 15 also supports the component 14 during the soldering process. The force applicator 15 is made of any suitable material to enhance heat dissipation from the equipment. This arrangement increases the amount of usable circuit board area while enhancing thermal efficiency. Moreover, the arrangement of the invention simplifies the assembly and soldering process and ensures optimum heat dissipation.

Of course, the order of assembly of the heat sink assembly may be varied depending on the particular application. For instance, the retainer 12 and force applicator 15 may be positioned on the circuit board with the components 14 are positioned adjacent these members on the circuit board in the known manner.

In order to provide the necessary clamping force between the component 14 and the force applicator, the product case cover 13 is provided with housing members 13a which cover the power devices 14 thereby sandwiching the components 14 between the cover 13 and the force applicator 15. Thus, there is a direct contact between the case and the power devices to further enhance heat dissipation. As stated above, the stanchion 15a serves to vary the contact force between the cover 13 and the applicator 15 for optimum heat transfer.

Figure 6:
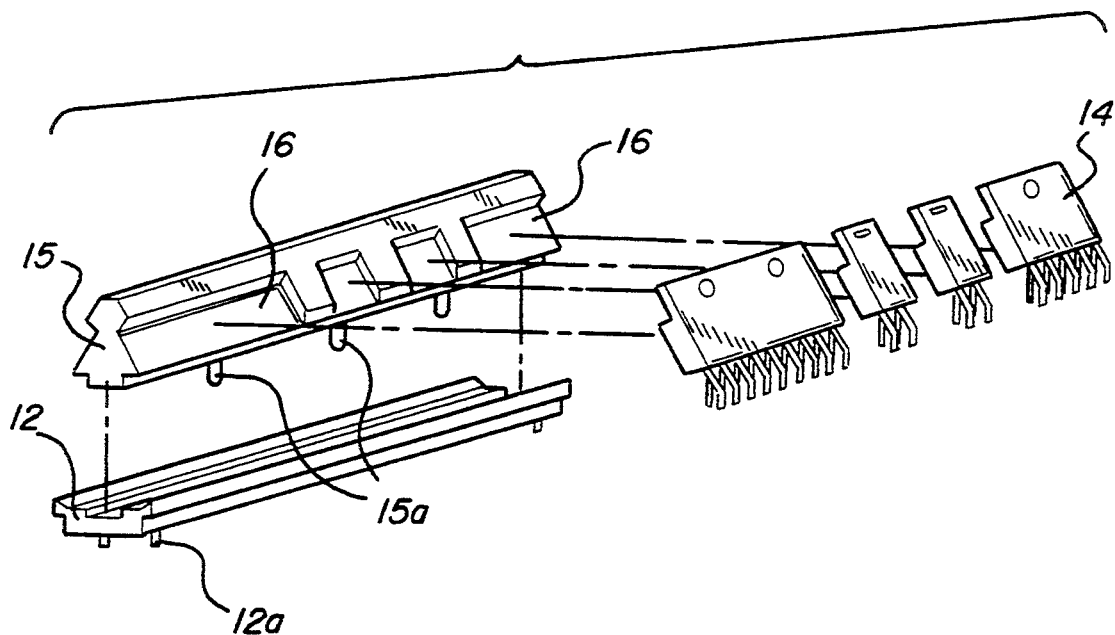
FIG. 6 is a perspective view of the electrical components being positioned in the force applicator.

FIG. 6 is a perspective view of the above mentioned embodiment and illustrates the structural relation of the electrical components 14, the force applicator 15 and the retainer 12. Although the components 14 are illustrated as being mounted to a single force applicator 15, it should be understood that each electrical component 14 may be provided with an individual force applicator 15 and stanchion 15a such that the clamping force for each component 14 may be separately adjusted. Thus, the heat dissipation from each component may be individually controlled or adjusted for a particular application.

Figure 7:
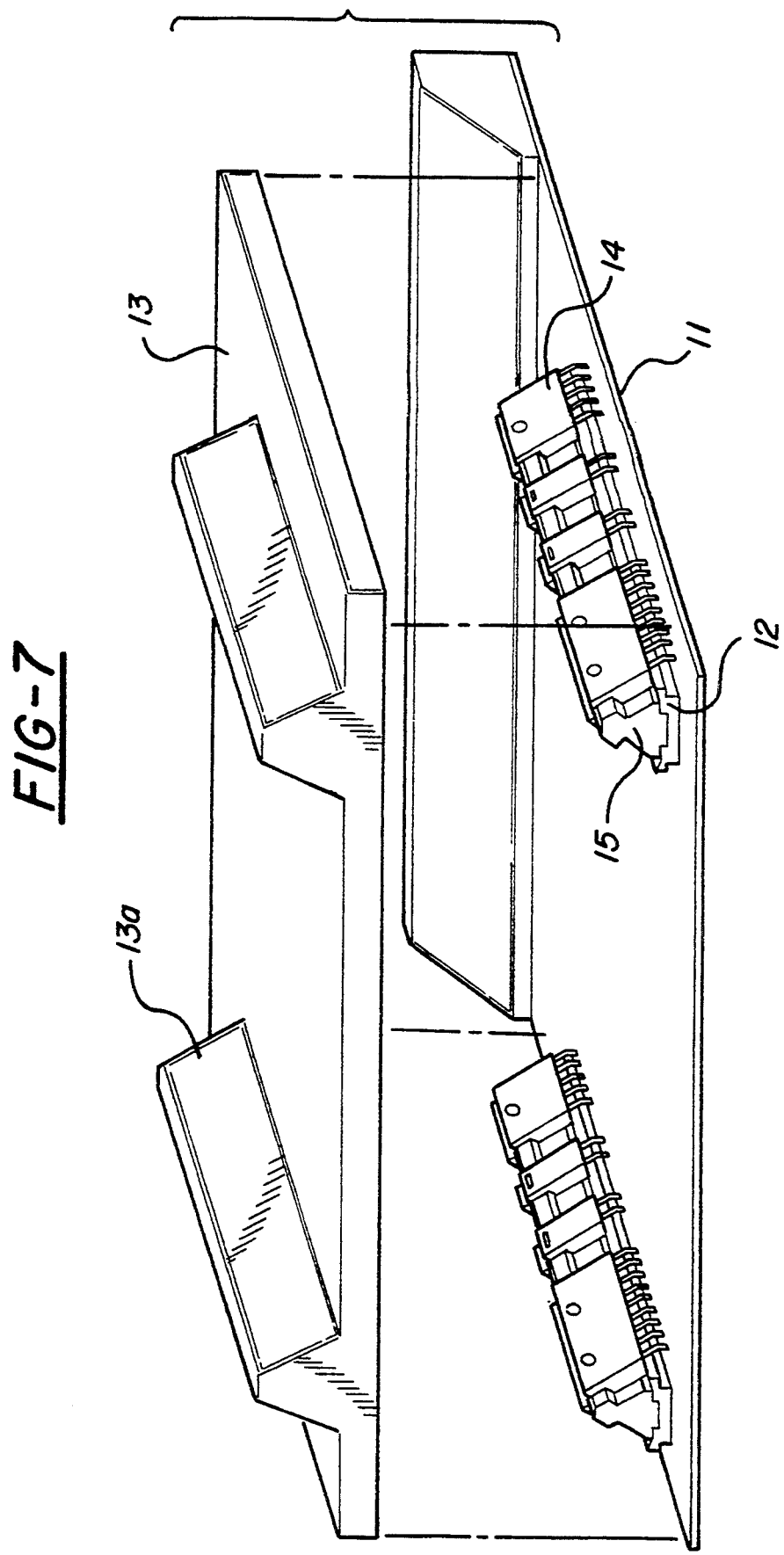
FIG. 7 is a perspective view of the circuit, board arrangement of the invention without the casing cover.

FIG. 7 is the perspective view of the preferred embodiment with the heat sink assembly positioned on an unenclosed printed circuit board 11. The cover 13, having associated housing members 13a, is positioned over the circuit board 11 so as to effect the clamping force necessary for proper thermal performance.

Figure 8:
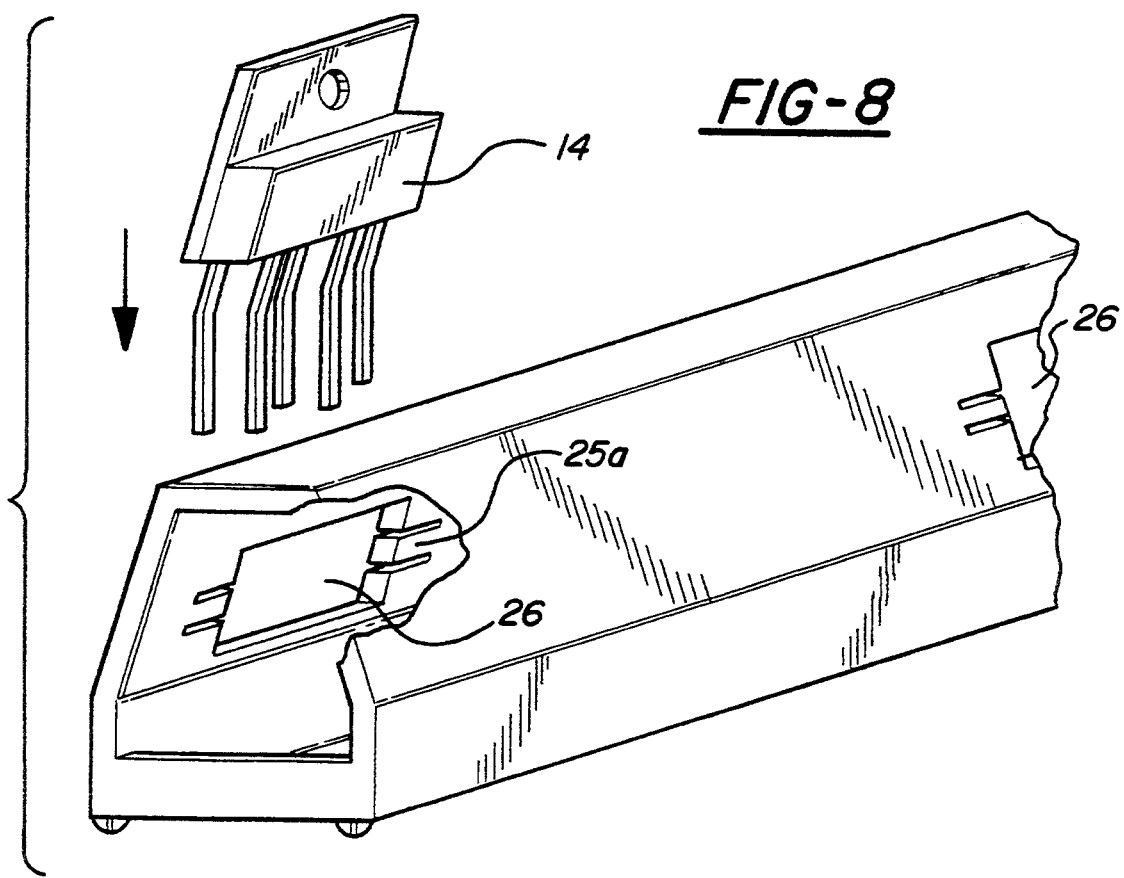
FIG. 8 is a perspective view of the component receiving body of the second embodiment.
Figure 9:
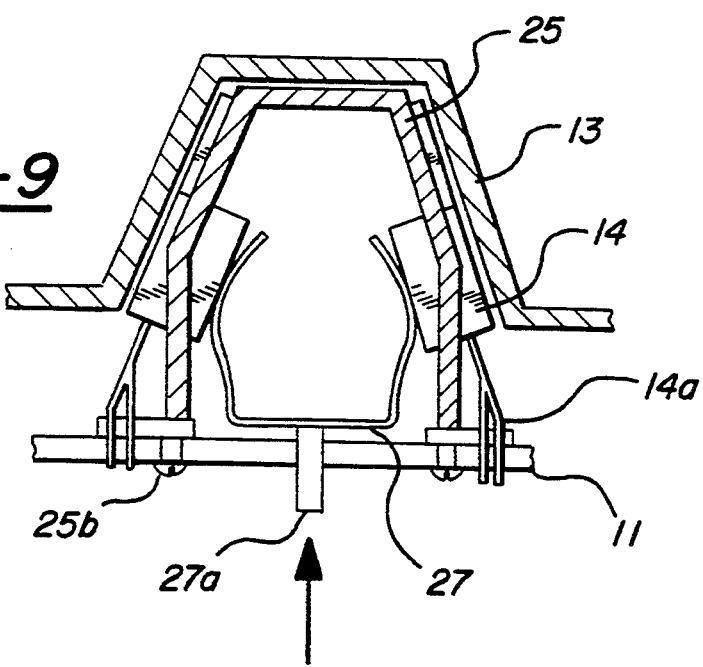
FIG. 9 is a side view of the second embodiment positioned on the circuit board with the cover applied.

FIGS. 8 and 9 illustrate a second embodiment of the invention whereby the force applicator of FIG. 5 is replaced with a component receiving body 25 which is formed to receive the electrical components 14 at various openings 26 provided along its length (FIG. 8). The number and type of openings 26 will depend on the design and application for the control module.

Spring fingers 25a are formed in the receiving body 25 to grip the component in order to provide support during soldering. A force adjusting spring 27 is positioned within the receiving body and functions to adjust the clamping force applied to the component 14, similar to the force applicator 15 of FIG. 5. As shown in FIG. 9, adjusting spring 27 comprises a stanchion 27a which passes through the circuit board 11 in order that the force for spring action as required for optimum heat transfer may be appropriately adjusted. The component receiving body is affixed to the circuit board for example by the snap-fit projection 25b shown in FIG. 9.

As with the first embodiment, each component 14 may be provided with an individual force adjusting spring 27 designed for the desired heat dissipation requirements. Moreover, the electrical components 14 are suitably supported on the circuit board and are provided with leads 14a which pass through the circuit board for soldering by known methods.

Figure 10:
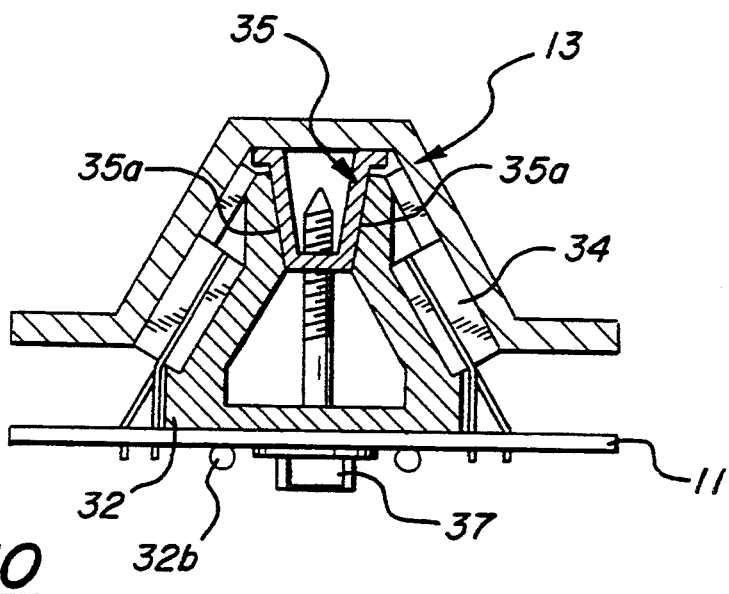
FIG. 10 is a side view of the third embodiment positioned on the circuit board with the cover applied.
Figure 11:
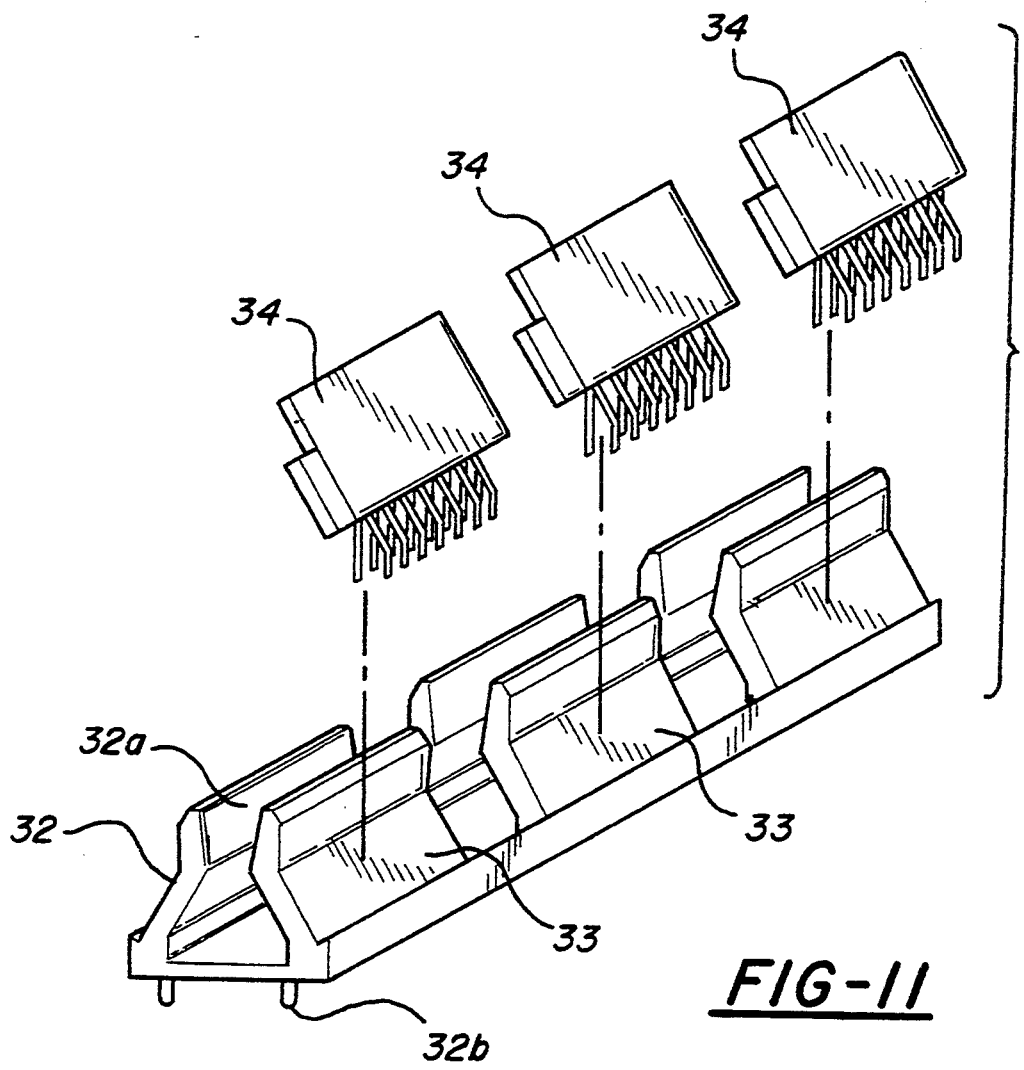
FIG. 11 is a perspective view of the retainer electrical components of the third embodiment.

FIGS. 10 and 11 illustrate a third embodiment of the invention whereby the retainer 12 and force applicator 15 of FIG. 5 is modified so as to comprise the retainer 32 and cover channel 35 as illustrated in FIG. 10. The retainer 32 functions in the same manner as the retainer 12 of the first embodiment whereby the electric components 34 are adequately supported during the soldering process.

The cover channel 35 is formed with angled opposed surfaces 35a and is received in an opening 32a formed in the retainer 32. The angled opposed surfaces 35a contact the inner surfaces of the opening 32a such that the opposed walls 33 of the retainer 32 are forced apart as the cover channel penetrates the opening 32a. This arrangement creates the clamping force against the cover 13 which enhances the dissipation of thermal energy from the components 34. The opposed walls 33 are formed to receive and support the components 34 similar to the recess 16 provided in the first embodiment (FIG. 6).

In order to adjust the clamping force applied to each electrical components 34, a screw 37 is provided which passes through the circuit board 11 and threadingly engages the cover channel 35. The screw 37 serves to mount the circuit board 11 into the case and at the same time generates the clamping forces need for proper thermal dissipation. As the screw 37 is tightened, the cover channel 35 is further drawn into the opening 32a; thus, the opposed walls 33 of the retainer 32 are further forced apart to increase the clamping force between the retainer 32 and the cover 13.

As with the previous embodiments, the clamping forces may be individually adjusted for each component depending on the desired heat dissipation requirements, and moreover, the components 34 are soldered to the circuit board in a known manner via leads 14a and the retainer 32 is affixed to the circuit board for example by the snap-fit projection 32b shown in FIGS. 10 and 11.

From the foregoing description it is understood that the invention provides a heat sink arrangement which is easy to assemble and maximizes the usable area of the circuit board. The force adjustor 15a, 27a and screw 37 permits the adjustment of the contact force with the electrical components to enhance thermal efficiency. The specific type of force adjustment means employed may vary to suit the particular application.

It should be understood by those skilled in the art that the invention is not limited to the particular embodiment shown and described above, but that various changes and modifications may be made without departing from the scope of the present invention.

Having thus described the invention, I claim:

1. A heat sink assembly for heat generating electrical components comprising:

a retainer having first and second opposed walls defining a central cavity and an opening into said cavity; and a housing having first and second opposed heat dissipative wall sections parallel to said first and second retainer walls, respectively, said housing wall sections having outer surfaces facing away from said heat generating components and inner surfaces which, together with said first and second retainer walls, respectively sandwich first and second parallel extending rows of said heat generating components, said housing further having a channel disposed at the opening of said retainer and extending into said cavity for biasing said first and second retainer walls toward said first and second internal surfaces of said housing, respectively.

2. The heat sink assembly of claim 1, wherein said housing functions as a portion of a cover for said assembly.

3. The heat sink assembly of claim 1, including means for drawing said housing channel into said cavity to adjust the biasing of said retainer walls.

4. A heat sink assembly for heat generating electrical components mounted on a circuit board comprising:

a retainer disposed on said circuit board and having first and second opposed walls defining a central cavity and an opening into said cavity; and a housing having first and second internal opposed surfaces parallel to said first and second retainer walls, the heat generating electrical components being disposed in first and second parallel rows, said first row of components being sandwiched between said first retainer wall and said first internal surface of said housing, and said second row of components being sandwiched between said second retainer wall and said second internal surface of said housing, said housing further having a channel disposed at said opening of said retainer and extending into said cavity for biasing said first and second retainer walls toward said first and second internal surfaces of said housing, respectively.

5. The heat sink assembly of claim 4, wherein said housing functions as a portion of a cover for said assembly.

6. The heat sink assembly of claim 4, further comprising means for drawing said housing channel into said cavity to adjust the biasing of said retainer walls.

* * * * *